United States Patent
Lee

(10) Patent No.: US 9,465,467 B2
(45) Date of Patent: Oct. 11, 2016

(54) FLEXIBLE PRINTED CIRCUIT BOARD AND TOUCH PANEL INCLUDING THE SAME

(71) Applicant: LG Display Co., Ltd., Seoul (KR)

(72) Inventor: Sunghoon Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 21 days.

(21) Appl. No.: 14/564,335

(22) Filed: Dec. 9, 2014

(65) Prior Publication Data

US 2016/0070376 A1    Mar. 10, 2016

(30) Foreign Application Priority Data

Sep. 5, 2014    (KR) .................. 10-2014-0119387

(51) Int. Cl.
| | | |
|---|---|---|
| *G06F 3/041* | (2006.01) | |
| *H05K 1/02* | (2006.01) | |
| *H05K 1/11* | (2006.01) | |
| *H05K 1/14* | (2006.01) | |

(52) U.S. Cl.
CPC ............ *G06F 3/041* (2013.01); *H05K 1/0281* (2013.01); *G06F 2203/04102* (2013.01); *H05K 1/118* (2013.01); *H05K 1/148* (2013.01); *H05K 2201/058* (2013.01); *H05K 2201/09781* (2013.01); *H05K 2201/1034* (2013.01); *H05K 2201/10356* (2013.01); *H05K 2201/2009* (2013.01)

(58) Field of Classification Search
CPC ................ G06F 3/0488; G06F 3/041; G06F 2203/04103; G06F 3/0202; G06F 2203/04102
See application file for complete search history.

(56) References Cited

U.S. PATENT DOCUMENTS

| 7,531,954 | B2 * | 5/2009 | Yamada ................ G09G 3/325 313/498 |
|---|---|---|---|
| 2004/0173884 | A1 | 9/2004 | Kashiwagi et al. |
| 2005/0219230 | A1 * | 10/2005 | Nakayama ............. G06F 3/016 345/173 |
| 2012/0092831 | A1 | 4/2012 | Chang |
| 2012/0092837 | A1 | 4/2012 | Tanaka et al. |

FOREIGN PATENT DOCUMENTS

| EP | 1651015 A1 | 4/2006 |
|---|---|---|
| JP | 2000-252602 A | 9/2000 |
| JP | 2001-326440 A | 11/2001 |

(Continued)

OTHER PUBLICATIONS

Extended European Search Report issued in corresponding European Patent Application No. 14192956.2 dated Sep. 24, 2015.

*Primary Examiner* — Md Saiful A Siddiqui
(74) *Attorney, Agent, or Firm* — Morgan, Lewis & Bockius LLP

(57) ABSTRACT

A flexible printed circuit board having enhanced peeling force and a touch panel including the same are provided. The flexible printed circuit board (FPCB) includes a first bonding portion and a second bonding portion respectively bonded to a first circuit unit and a second circuit unit. The first bonding portion includes a pad corresponding portion corresponding to pads of the first circuit unit and dummy portions outwardly extending from both end portions of the pad corresponding portion. An FPCB wiring formation portion includes FPCB wirings respectively connected to the pads and extending from the first bonding portion to the second bonding portion and concave portions respectively disposed to be adjacent to the dummy portions and having a curved surface.

8 Claims, 2 Drawing Sheets

(56) References Cited

FOREIGN PATENT DOCUMENTS

| | | | |
|---|---|---|---|
| JP | 2011-151300 A | 8/2011 | |
| KR | 10-0332438 B1 | 4/2002 | |
| KR | 10-2008-0088008 A | 10/2008 | |
| WO | 2009/111660 A1 | 9/2009 | |

* cited by examiner

FLEXIBLE PRINTED CIRCUIT BOARD AND TOUCH PANEL INCLUDING THE SAME

This application claims the benefit of priority under 35 U.S.C. §119(a) to Korean Patent Application No. 10-2014-0119387 filed on Sep. 5, 2014, which is incorporated by reference herein in its entirety.

BACKGROUND OF THE INVENTION

1. Field of the Invention

This document relates to a flexible printed circuit board and a touch panel including the same, and more particularly, to a flexible printed circuit board having enhanced peeling force and a touch panel including the same.

2. Discussion of the Related Art

Flexible printed circuit boards (FPCBs), which are a type of printed circuit board (PCB) and are bendable, have advantages of enabling 3D wiring and reducing a size and weight. For this reason, recently, as electronic devices have been reduced in size and weight, FPCBs have been used in products whose service availability is limited due to a solid PCB or manual operation circuits or in various application fields requiring bending quality or space saving.

Hereinafter, an application of a related art FPCB to a touch panel will be described in detail with reference to FIG. 1. FIG. 1 is a view illustrating a related art FPCB applied to a touch panel.

Referring to FIG. 1, a touch panel TS includes touch electrodes Tx1 to Tx4 and Rx1 to Rx6, touch routing wirings TW1 to TW4 and RW1 to RW6, and touch pads TP1 to TP4 and RP1 to RP6, and an FPCB includes bonding portions BP1 and BP2 and an FPCB wiring formation portion WP.

The touch electrodes include a plurality of first touch electrodes Tx1 to Tx4 arranged to be parallel in a first direction such as a horizontal direction and a plurality of second touch electrodes Rx1 to Rx6 arranged to be parallel in a second direction such as a vertical direction intersecting the first direction.

The touch routing wirings include first touch routing wirings TW1 to TW4 having one ends respectively connected to the plurality of first touch electrodes Tx1 to Tx4 and second touch routing wirings RW1 to RW6 having one ends respectively connected to the plurality of second touch electrodes Rx1 to Rx6.

The touch pads include first touch pads TP1 to TP4 respectively connected to the other ends of the first touch routing wirings TW1 to TW4 and second touch pads RP1 to RP6 respectively connected to the other ends of the second touch routing wirings RW1 to RW6.

The first bonding portion BP1 of the FPCB is a portion bonded to an end portion of the touch panel TS so as to be electrically in contact with the first and second touch pads TP1 to TP4 and RP1 to RP6, and the second bonding portion BP2 is a portion bonded to an external circuit (not shown). The FPCB wiring formation portion WP includes signal wirings FTW2, FTW4, FRW1~FRW6, FTW2, FTW1, respectively connecting the first and second touch pads TP2, TP4, RP1~RP6, TP2, TP1 of the touch panel TS to an external circuit.

In the related art FPCB described above, when external force acts on an outer portion of the first bonding portion BP1, a bonding region may be detached or an outer portion of the FPCB may be damaged to result in a separation of the FPCB from the touch panel TS.

Here, as the products tend to be reduced in size, a touch electrode formation portion in which the touch electrodes Tx1 to Tx4 and Rx1 to Rx6 are disposed and the outermost portion of the FPCB are in proximity to each other in the bonding region of the FPCB and the touch panel TS. Thus, even though only a portion of the first bonding portion BP1 of the FPCB is torn, defective touch driving may occur.

SUMMARY OF THE INVENTION

Accordingly, the present invention is directed to a flexible printed circuit board and touch panel including the same that substantially obviates one or more of the problems due to limitations and disadvantages of the related art.

An object of the present invention is to provide a flexible printed circuit board having enhanced peeling force sufficient not to be damaged with external force applied thereto.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and another advantages and in accordance with the purpose of the present invention, as embodied and broadly described, a flexible printed circuit board (FPCB) includes a first bonding portion and a second bonding portion respectively bonded to a first circuit unit and a second circuit unit. The first bonding portion may comprise a pad corresponding portion corresponding to pads of the first circuit unit and dummy portions outwardly extending from both end portions of the pad corresponding portion. An FPCB wiring formation portion may include FPCB wirings respectively connected to the pads and extending from the first bonding portion to the second bonding portion and concave portions respectively disposed to be adjacent to the dummy portions and having a curved surface.

In another aspect, a touch panel includes touch electrodes, touch routing wirings having one end portions respectively connected to the touch electrodes, and touch pads respectively connected to the other end portions of the touch routing wirings. The touch panel may comprise a flexible printed circuit board (FPCB) including a bonding portion including a pad corresponding portion corresponding to the touch pads of the touch panel and dummy portions outwardly extending from both ends portions of the pad corresponding portion, and FPCB wiring formation portion including FPCB wirings respectively connected to the touch pads and arranged to extend to an end thereof and concave portions respectively disposed to be adjacent to the dummy portions and having a curved surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
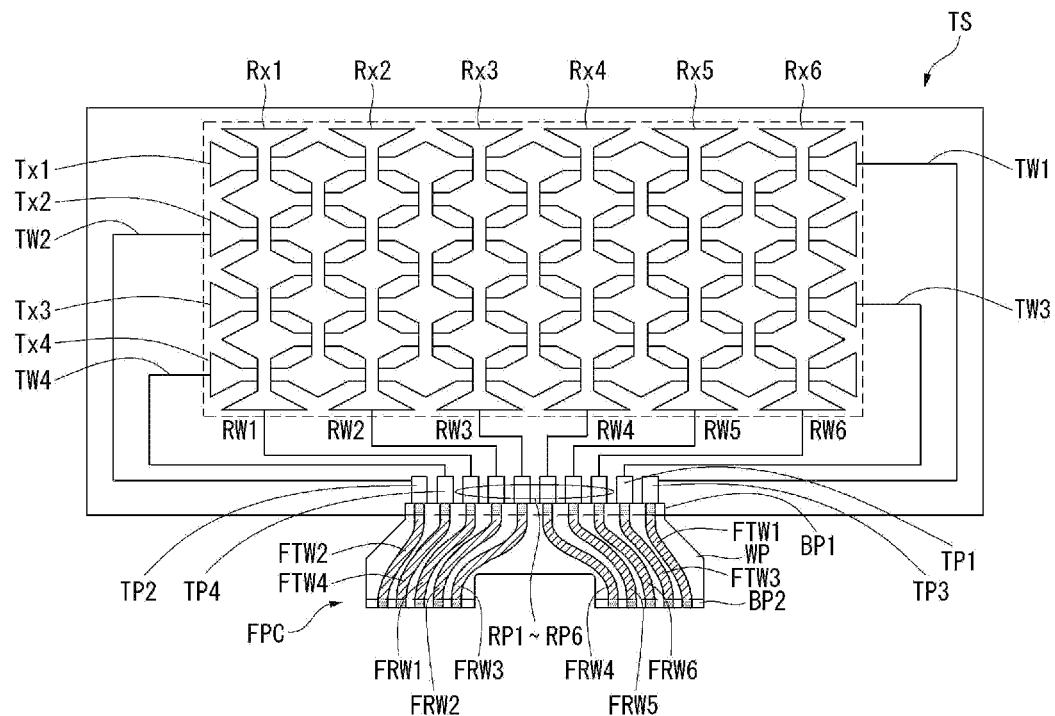
FIG. 1 is a view illustrating a related art flexible printed circuit board applied to a touch panel.

Hereinafter, embodiments of the present invention will be described in detail with reference to the accompanying drawings. Throughout the specification, the like reference numerals denote the substantially same elements. In describing the present invention, if a detailed explanation for a related known function or construction is considered to unnecessarily divert the gist of the present invention, such explanation will be omitted.

Figure 2:
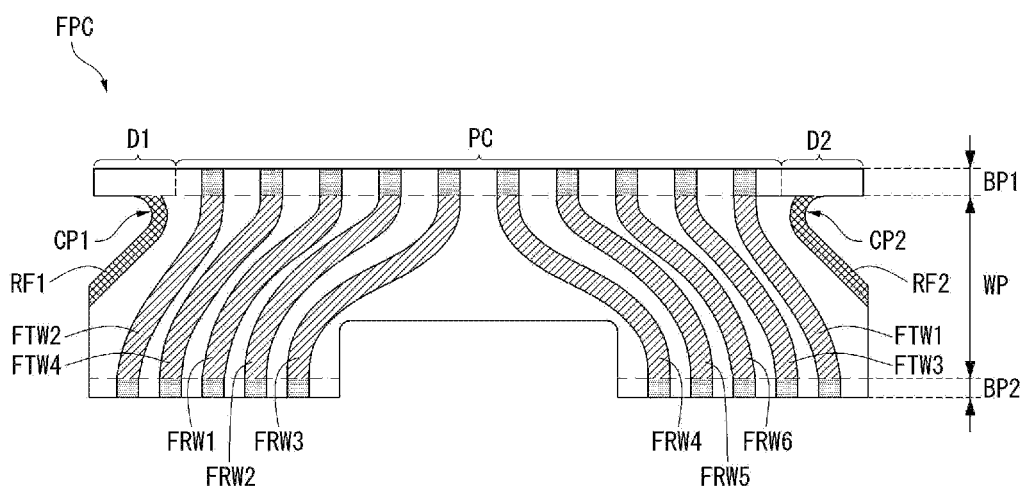
FIG. 2 is a plan view illustrating a flexible printed circuit board according to an embodiment of the present invention.

A flexible printed circuit board (FPCB) according to an embodiment of the present invention will be described in detail with reference to FIG. 2. FIG. 2 is a plan view illustrating an FPCB according to an embodiment of the present invention.

Referring to FIG. 2, the FPCB according to an embodiment of the present invention includes a first bonding portion BP1, an FPCB wiring formation portion WP, and a second bonding portion BP2, as connectors for electrically connecting separated first and second circuit devices.

The first bonding portion BP1 is a portion disposed at one end portion of the FPCB and bonded to a pad region in which pads of the first circuit device are disposed. The first bonding portion BP1 includes a pad corresponding portion PC and first and second dummy portions D1 and D2 outwardly extending from both end portions of the pad corresponding portion PC, respectively.

A region of the first bonding portion BP1 bonded with the first circuit device is increased by the first and second dummy portions D1 and D2. Thus, since the region bonding the FPCB to the first circuit device is increased by the region corresponding to the first and second dummy portions D1 and D2, even though external force is applied from the left and right sides of the FPCB, the region of the pad corresponding portion PC is not damaged. Thus, generation of a defect product due to damage to the FPCB can be prevented.

The FPCB wiring formation portion WP includes FPCB wirings FTW2, FTW4, FRW1 to FRW6, FTW3, FTW1 arranged from the pad corresponding portion PC of the first bonding portion BP1 to the second bonding portion to form an electrical path for connecting the first circuit device and the second circuit device.

The FPCB wiring formation portion WP includes first and second concave portions CP1 and CP2 disposed to have a curved surface outwardly at both corner portions adjacent to the first and second dummy portions D1 and D2 of the first bonding portion BP1.

Since the first and second concave portions CP1 and CP2 having a curved surface are disposed at both corner portions of the FPCB wiring formation portion WP adjacent to the first and second dummy portions D1 and D2, even though impact is applied to the FPCB wiring formation portion WP from the outside, the impact is absorbed to the first and second concave portions CP1 and CP2, whereby the first bonding portion BP1 of the FPCB is prevented from being torn due to external force, thus preventing generation of a defective product.

The FPCB wiring formation portion WP may further include first and second reinforcing patterns RF1 and RF2 independently disposed on the regions of the first and second concave portions CP1 and CP2. The first and second reinforcing patterns RF1 and RF2 may extend to a portion spaced apart from the second bonding portion BP2 or may extend to reach the second bonding portion BP2, along both lateral portions of the FPCB wiring formation portion WP. The first and second reinforcing patterns RF1 and RF2 may be formed of a metal having excellent conductivity identical to that of the FPCB wirings FTW2, FTW4, FRW1 to FRW6, FTW3, FTW1, and electrically float from any other components, as well as the first and second circuit devices.

Since the first and second reinforcing patterns RF1 and RF2 of the FPCB wiring formation portion WP are formed of a metal and disposed along the both lateral portions of the FPCB wiring formation portion WP, rigidity of the FPCB can be reinforced. Thus, even though external impact is applied, the FPCB can be prevented from being damaged.

Figure 3:
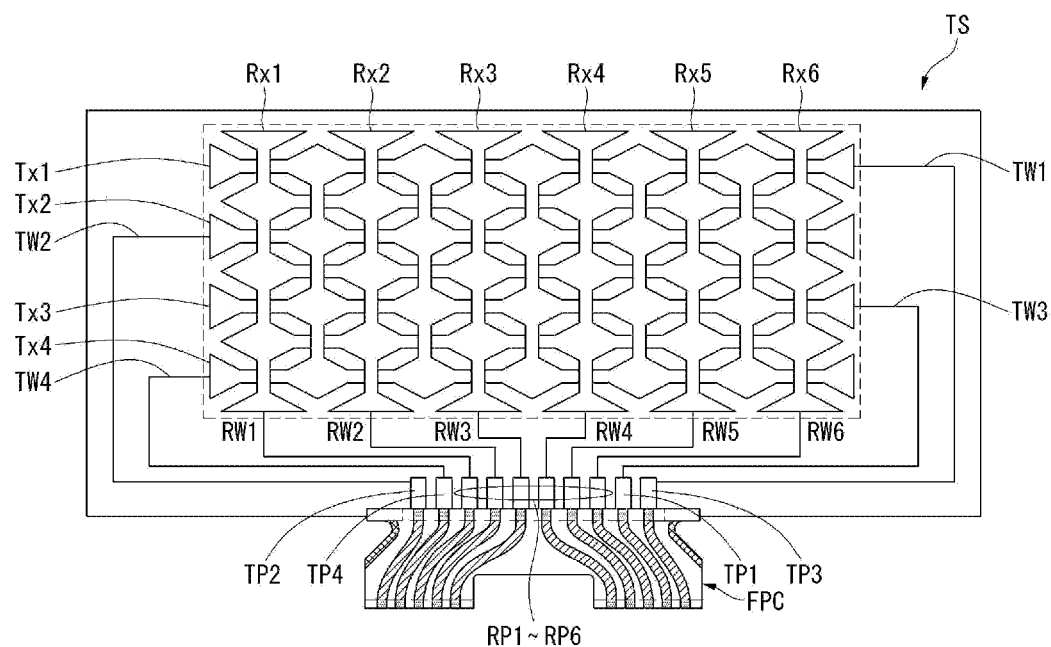
FIG. 3 is a view schematically illustrating a state in which the flexible printed circuit board according to an embodiment of the present invention is applied to a touch panel.

Hereinafter, a case in which the FCPB according to an embodiment of the present invention is applied to a touch panel will be described with reference to FIG. 3. FIG. 3 is a view schematically illustrating a state in which the flexible printed circuit board according to an embodiment of the present invention is applied to a touch panel.

Referring to FIG. 3, a touch panel TS including the FPCB according to an embodiment of the present invention includes touch electrodes Tx1 to Tx4 and Rx1 to Rx6, touch routing wirings TW1 to TW4 and RW1 to RW6, and touch pads TP1 to TP4 and RP1 to RP6.

The touch electrodes include a plurality of first touch electrodes Tx1 to Tx4 arranged to be parallel in a first direction as a horizontal direction and a plurality of second touch electrodes Rx1 to Rx6 arranged to be parallel in a second direction as a vertical direction intersecting the first direction.

The touch routing wirings include first touch routing wirings TW1 to TW4 having one ends respectively connected to the plurality of first touch electrodes Tx1 to Tx4 and second touch routing wirings RW1 to RW6 having one ends respectively connected to the plurality of second touch electrodes Rx1 to Rx6.

The touch pads include first touch pads TP1 to TP4 respectively connected to the other ends of the first touch routing wirings TW1 to TW4 and second touch pads RP1 to RP6 respectively connected to the other ends of the second touch routing wirings RW1 to RW6.

The first bonding portion BP1 of the FPCB is bonded to an end portion of the touch panel TS so as to be electrically in contact with the first and second touch pads TP1 to TP4 and RP1 to RP6. The pad corresponding portion PC of the first bonding portion BP1 may overlap the touch pads TP1 to TP4 and RP1 to RP6, and the first and second dummy portions D1 and D2 do not overlap any of the touch pads TP1 to TP4 and RP1 to RP6. The second bonding portion BP2 is a portion bonded to an external circuit (not shown).

The FPCB wiring formation portion WP of the FPCB includes FPCB wirings FTW2, FTW4, FRW1 to FRW6, FTW2, FTW1 respectively connecting the first and second touch pads TP2, TP4, RP1 to RP6, TP2, TP1 of the touch panel TS to an external circuit. The FPCB wirings FTW2, FTW4, FRW1 to FRW6, FTW2, FTW1 are arranged to extend from the first bonding portion BP1 to the second bonding portion BP2.

As described above, in the touch panel having the PFCB according to an embodiment of the present invention, since the first bonding portion includes the first and second dummy portions and the FPCB wiring formation portion includes the first and second reinforcing portions together with the first and second concave portions, even though external impact is applied, the FPCB can be prevented from being damaged by the impact or the pad corresponding portion of the first bonding portion can be prevented from being torn off from the touch panel. Thus, defective touch driving due to damage to the FPCB can be prevented.

According to the FPCB of example embodiments of the present invention, since the first bonding portion includes the first and second dummy portions in addition to the pad corresponding portion, a bonded region can be increased by the first and second dummy portions. Thus, even though external force is applied from the left and right sides of the FPCB, the region of the pad corresponding portion cannot be damaged. Thus, generation of a defective product due to damage to the FPCB can be prevented.

Also, according to the FPCB of example embodiments of the present invention, since the first and second concave portions having a curved surface are disposed at both corner portions of the wiring formation portion adjacent to the first and second dummy portions, even though external impact is applied to the wiring formation portion, the impact is absorbed to the first and second concave portions, whereby the first bonding portion of the FPCB can be prevented from being torn by the external force, thus preventing generation of a defective product.

Further, according to the FPCB of example embodiments of the present invention, since the first and second reinforcing patterns of the wiring formation portion are disposed along both lateral portions of the concave portions of the wiring formation portion and formed of a metal, rigidity of the FPCB can be reinforced. Thus, even though external impact is applied, the FPCB can be prevented from being damaged by the impact.

It will be apparent to those skilled in the art that various modifications and variations can be made in the flexible circuit board and touch panel including the same of the present invention without departing from the spirit or scope of the invention. Thus, it is intended that the present invention cover the modifications and variations of this invention provided they come within the scope of the appended claims and their equivalents.

What is claimed is:

1. A flexible printed circuit board (FPCB) including a first bonding portion and a second bonding portion respectively bonded to a first circuit unit and a second circuit unit, the FPCB comprising:
   the first bonding portion including a pad corresponding portion corresponding to pads of the first circuit unit and dummy portions outwardly extending from both end portions of the pad corresponding portion; and
   an FPCB wiring formation portion including FPCB wirings respectively connected to the pads and extending from the first bonding portion to the second bonding portion and concave portions respectively disposed to be adjacent to the dummy portions and having a curved surface,
   wherein the FPCB wiring formation portion further includes reinforcing patterns along lateral side edges of the FPCB at regions in which the concave portions are disposed, and
   wherein the reinforcing patterns include a metal having a conductivity that is identical to that of the FPCB wirings.

2. The flexible printed circuit board of claim 1, wherein the reinforcing patterns are between the first and second bonding portions on the lateral side edges of the FPCB.

3. A flexible printed circuit board (FPCB) including a first bonding portion and a second bonding portion respectively bonded to a first circuit unit and a second circuit unit, the FPCB comprising:
   the first bonding portion including a pad corresponding portion corresponding to pads of the first circuit unit and dummy portions outwardly extending from both end portions of the pad corresponding portion; and
   an FPCB wiring formation portion including FPCB wirings respectively connected to the pads and extending from the first bonding portion to the second bonding portion and concave portions respectively disposed to be adjacent to the dummy portions and having a curved surface,
   wherein the FPCB wiring formation portion further includes reinforcing patterns along lateral side edges of the FPCB at regions in which the concave portions are disposed, and
   wherein the reinforcing patterns include a metal and are independently disposed along the lateral side edges of the FPBC to be electrically floated.

4. The flexible printed circuit board of claim 3, wherein the reinforcing patterns are between the first and second bonding portions on the lateral side edges of the FPCB.

5. A touch panel including a touch panel including touch electrodes, touch routing wirings having one end portions respectively connected to the touch electrodes, and touch pads respectively connected to other end portions of the touch routing wirings, the touch panel comprising:
   a flexible printed circuit board (FPCB) including a bonding portion including a pad corresponding portion corresponding to the touch pads of the touch panel and dummy portions outwardly extending from both ends portions of the pad corresponding portion, and an FPCB wiring formation portion including FPCB wirings respectively connected to the touch pads and arranged to extend to an end thereof and concave portions respectively disposed to be adjacent to the dummy portions and having a curved surface,
   wherein the FPCB wiring formation portion further includes reinforcing patterns along lateral side edges of the FPCB at regions in which the concave portions are disposed, and
   wherein the reinforcing patterns include a metal having a conductivity that is identical to that of the FPCB wirings.

6. The touch panel of claim 5, wherein the reinforcing patterns are between the first and second bonding portions on the lateral side edges of the FPCB.

7. A touch panel including a touch panel including touch electrodes, touch routing wirings having one end portions respectively connected to the touch electrodes, and touch pads respectively connected to other end portions of the touch routing wirings, the touch panel comprising:
   a flexible printed circuit board (FPCB) including a bonding portion including a pad corresponding portion corresponding to the touch pads of the touch panel and dummy portions outwardly extending from both ends portions of the pad corresponding portion, and an FPCB wiring formation portion including FPCB wirings respectively connected to the touch pads and arranged to extend to an end thereof and concave portions respectively disposed to be adjacent to the dummy portions and having a curved surface, wherein the FPCB wiring formation portion further includes reinforcing patterns along lateral side edges of the FPCB at regions in which the concave portions are disposed, and wherein the reinforcing patterns include a metal and are independently disposed along the lateral side edges of the FPBC to be electrically floated.

8. The touch panel of claim 7, wherein the reinforcing patterns are between the first and second bonding portions on the lateral side edges of the FPCB.

* * * * *